(12) United States Patent
Kumar et al.

(10) Patent No.: US 9,500,703 B2
(45) Date of Patent: Nov. 22, 2016

(54) SEMICONDUCTOR STRUCTURE HAVING TEST DEVICE

(71) Applicant: GLOBALFOUNDRIES Inc., Grand Cayman (KY)

(72) Inventors: Anil Kumar, Clifton Park, NY (US);
Suresh Uppal, Clifton Park, NY (US);
Manjunatha Prabhu, Malta, NY (US);
William McMahon, Scarsdale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 263 days.

(21) Appl. No.: 14/462,643

(22) Filed: Aug. 19, 2014

(65) Prior Publication Data

US 2016/0054383 A1 Feb. 25, 2016

(51) Int. Cl.
*G01R 31/26* (2014.01)
*G01R 31/28* (2006.01)

(52) U.S. Cl.
CPC ....... *G01R 31/2884* (2013.01); *G01R 31/2601* (2013.01); *G01R 31/2644* (2013.01)

(58) Field of Classification Search
CPC .. G01R 31/26; G01R 31/28; G01R 31/2884; G01R 31/2817; G01R 31/2849; G01R 31/2855; G01R 31/2601; G01R 31/2642; G01R 31/2644; G01R 27/324; G01R 31/003
See application file for complete search history.

(56) References Cited

U.S. PATENT DOCUMENTS

| 2008/0092002 | A1* | 4/2008 | Shimooka | ........ G01R 31/31853 714/731 |
| 2009/0167336 | A1* | 7/2009 | La Rosa | ............ G01R 31/2858 324/750.3 |
| 2010/0315116 | A1* | 12/2010 | Seya | ................ G01R 31/31721 324/762.01 |
| 2013/0293250 | A1* | 11/2013 | McMahon | ............. G01R 31/30 324/750.3 |

* cited by examiner

*Primary Examiner* — Son Le
(74) *Attorney, Agent, or Firm* — Heslin Rothenberg Farley and Mesiti PC; Nicholas Mesiti (57) ABSTRACT

There is set forth herein a semiconductor structure including a plurality of test devices, the plurality of test devices including a first test device and a second test device. A semiconductor structure can also include a waveform generating circuit, the waveform generating circuit configured for application of a first stress signal waveform having a first duty cycle to the first test device, and a second stress signal waveform having a second duty cycle to the second test device. A semiconductor structure can include a selection circuit associated with each of the first test device and the second test device for switching between a stress cycle and a sensing cycle.

14 Claims, 6 Drawing Sheets

SEMICONDUCTOR STRUCTURE HAVING TEST DEVICE

FIELD OF THE INVENTION

The present invention relates to semiconductor structures, and more particularly to a semiconductor structure having a test device adapted for testing.

BACKGROUND OF THE INVENTION

A semiconductor wafer can be separated into individual dies and packaged as microchips (integrated circuits). These microchips can be quality tested to assure satisfactory performance. Microchips that fail quality testing reduce yields and increase effective per microchip fabrication costs. Failure analysis may be performed in an effort to improve the fabrication process and increase yields, and testing during the fabrication process may facilitate failure analysis. However, testing time during fabrication also reduces overall yields.

One parameter that can be tested for in a semiconductor structure is Bias Temperature Instability (BTI). BTI can occur when the device is subjected to elevated temperatures and high gate voltages while the remaining terminals are grounded. Device characteristics can be negatively impacted when a device is subject to high voltage and thermal stress. For example, a threshold voltage can change with high voltage and increased thermal stress.

BTI characterization is costly to develop in view of time requirements for performance of testing. A microchip can include a limited number of macro contact pads that are of such size to be contacted by probes of an external test unit. In one form, an external unit can include a source measurement unit (SMU).

BRIEF DESCRIPTION

There is set forth herein a semiconductor structure including a plurality of test devices, the plurality of test devices including a first test device and a second test device. A semiconductor structure can also include a waveform generating circuit, the waveform generating circuit configured for application of a first stress signal waveform having a first duty cycle to the first test device, and a second stress signal waveform having a second duty cycle to the second test device. A semiconductor structure can include a selection circuit associated with each of the first test device and the second test device for switching between a stress cycle and a sensing cycle.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
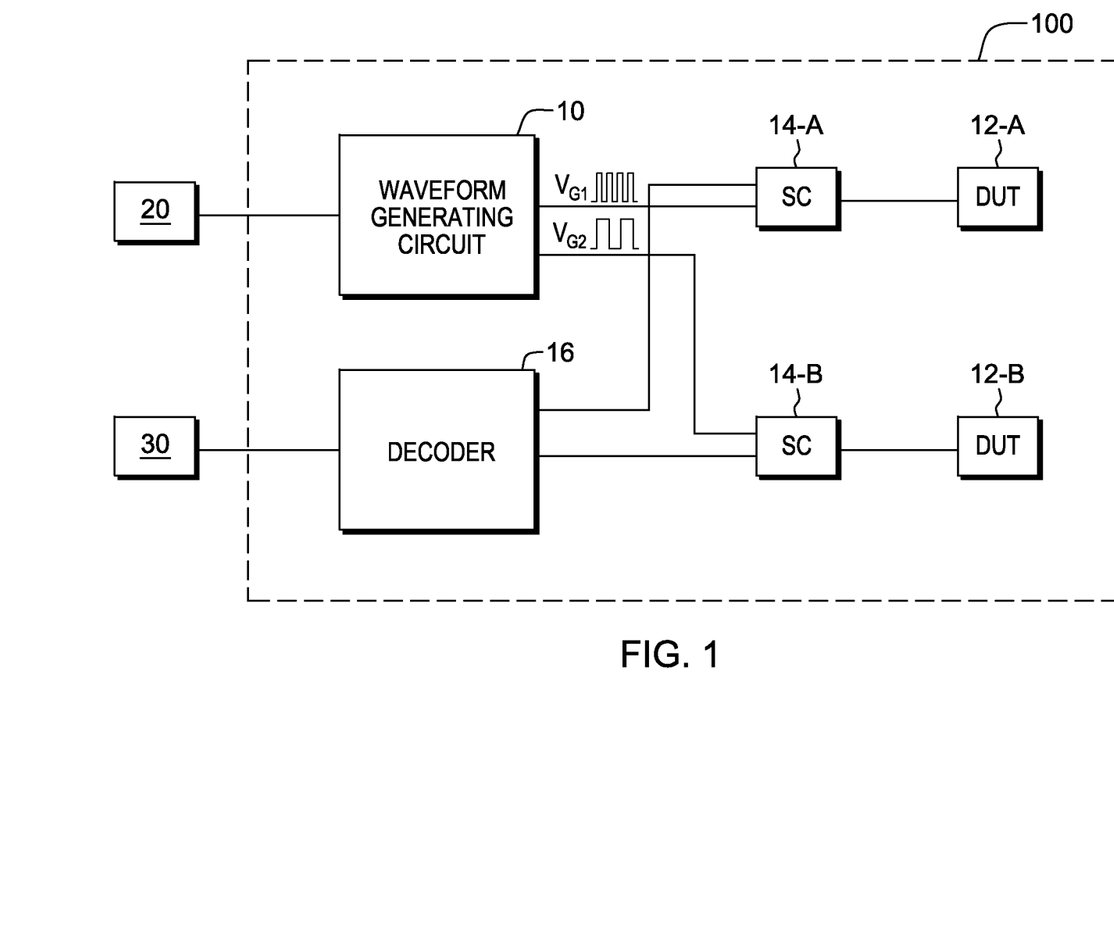
FIG. 1 depicts a schematic diagram for a semiconductor device having a test circuit.

There is set forth herein a semiconductor structure 100 including waveform generating circuit 10 and a plurality of test devices, the plurality of test devices including a first test device 12-A and a second test device 12-B. Each of test device 12-A and test device 12-B can be regarded to be a device under test (DUT). The waveform generating circuit 10 can be configured for application of a first waveform having a first duty cycle to the first test device 12-A, and for application of a second waveform having a second duty cycle to the second test device 12-B. In one embodiment, test device 12-A and test device 12-B can be provided by field effect transistors (FETs).

Semiconductor structure 100 can include a selection circuit associated with each of the first test device 12-A and the second test device 12-B. Waveform generating circuit 10 can apply the first waveform and the second waveform at a common time (simultaneously). For facilitation of switching between a stress cycle and a sensing cycle, selection circuit 14-A can be associated to test device 12-A and selection circuit 14-B can be associated to test device 12-B.

Waveform generating circuit 10 can apply a pulse width modulated (PWM) signal to multiple devices under test, e.g., devices 10-A and 10-B as shown in FIG. 1. Waveform generating circuit 10 can process a single applied clock signal received from an external unit 20 for output of a plurality of pulse width modulated (PWM) signals. External unit 20 in one embodiment can be provided by a clock of a Source Measurement Unit (SMU). In one aspect where test devices 10-A and 10-B are provided by FETs, waveform generating circuit 10 can apply a PWM stress signal waveform to gates of multiple DUTs e.g. test device 10-A and test device 10-B at a common time. In one aspect, waveform generating circuit 10 can apply PWM signals of a plurality of different duty cycles to a device under test (DUT). Waveform generating circuit 10 can apply a PWM stress signal waveform of a first duty cycle and pulse width to first test device 10-A and at a common time (simultaneously) can apply a PWM stress signal waveform of a second duty cycle and pulse width to second test device 10-B.

In one aspect, semiconductor structure 100 can include a decoder circuit 16. Decoder circuit 16 can be in communication with selection circuits 14-A and 14-B for control of test devices e.g. test device 10-A and test device 10-B. Based on an address presented thereto, decoder circuit 16 can communicate signals to an appropriate selection circuit 14-A or 14-B of semiconductor structure 100 to select one test device 12-A or 12-B out of a plurality of test devices for sensing. A sequence of addresses can be specified to decoder circuit 16 by external unit 30. When a particular one test device out of a plurality of test devices provided by a FET is selected for sensing using decoder circuit 16, a gate of the selected test device can be switched to an external supply voltage and a drain of the selected test device can be connected to a sense voltage instead of a ground voltage.

Regarding advantages of waveform generating circuit 10, waveform generating circuit 10 can generate waveforms having a variety of duty cycles for application to different test devices of semiconductor structure 100. There can be provided a measurement of a variety of AC duty cycles with application of one signal by external unit 20 to semiconductor structure 100. Large scale statistics can be generated quickly using a limited number of external signal inputs, e.g., a single clock signal input that can be input using external unit 20. External unit 20 can be provided by an SMU that presents a clock signal to waveform generating circuit 10. The providing of waveform generating circuit 10 facilitates a stressing of a plurality of a test devices at a common time, and accelerates testing of a semiconductor structure 100.

Figure 2:
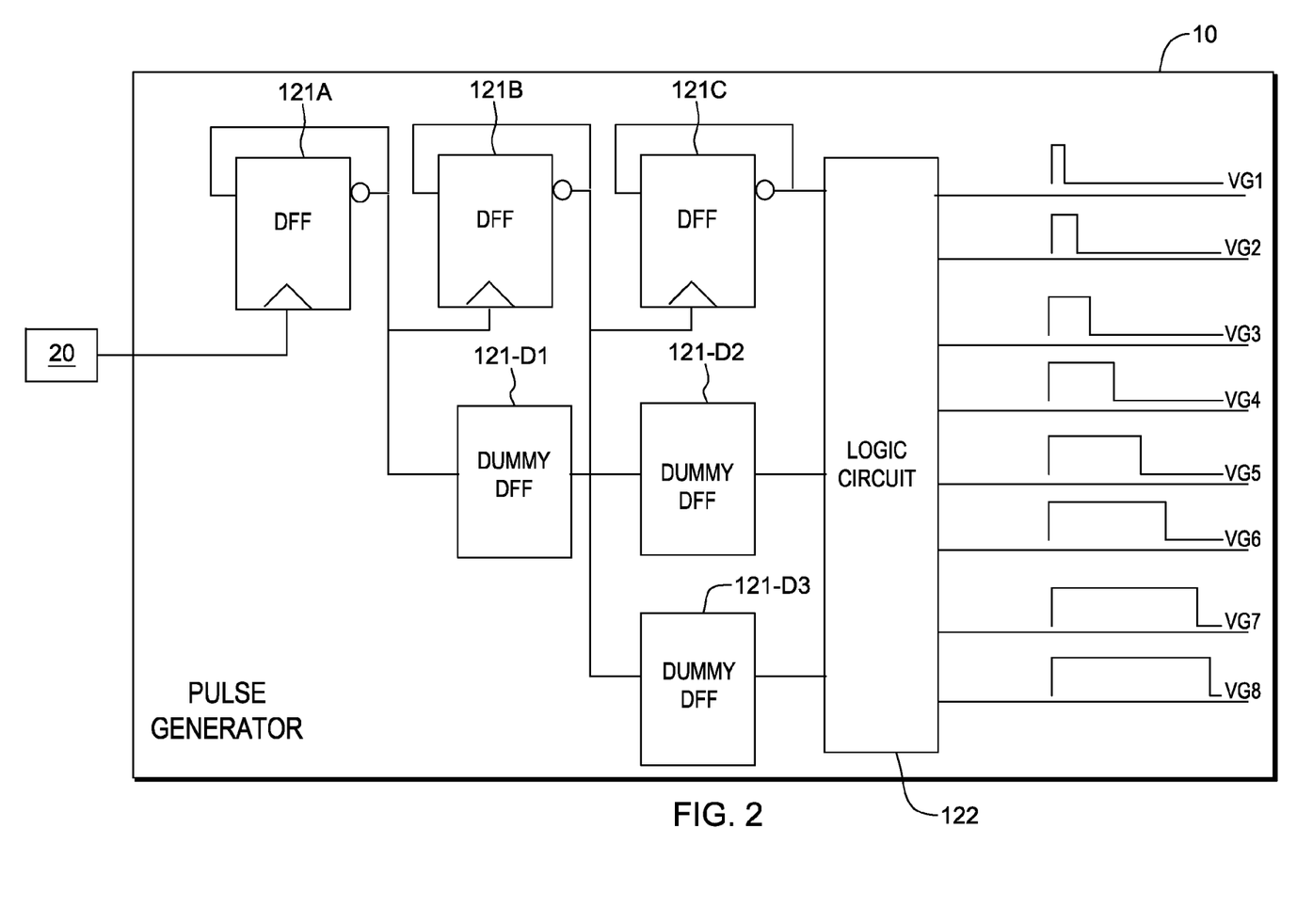
FIG. 2 is a circuit block diagram for a waveform generating circuit.

An example of a semiconductor structure 100 having a plurality of test devices in one specific example is shown and described in connection with FIGS. 2-5. Referring to FIG. 2, waveform generating circuit 10 can be operative to generate eight (8) gate voltages, VG1-VG8. The eight gate voltages are given by the voltages VG1-VG8. The gate voltages can have different duty cycles and different pulse widths. The gate voltages can have a common amplitude. Waveform generating circuit 10 can apply different gate voltages in the form of PWM stress signal waveforms to respective gates of different DUTs simultaneously (at a common time). In one aspect, waveform generating circuit 10 can apply such different gate voltages in the form of PWM stress signal waveforms to different DUTs so that each different gate voltage can have a different duty cycle and a common amplitude. Waveform generating circuit 10 can be configured so that when waveform generating circuit 10 is controlled to increase an amplitude of an applied gate voltage applied to a DUT, waveform generating circuit 10 can increase an amplitude of the applied gate voltage to each DUT so that waveform generating circuit 10 can, after such amplitude increase, continue to apply duty cycle differentiated PWM stress signal waveforms of common amplitude to each DUT having a gate voltage applied thereto.

Referring to operation of an exemplary waveform generating circuit 10 as shown in FIG. 2, waveform generating circuit 10 can process a single clock input received from external unit 20 and can output a plurality of pulse width modulated (PWM) signals to a plurality of test devices. In one aspect, waveform generating circuit 10 can include a plurality of D flip flops 121A, 121B, and 121C and a plurality of dummy D flip flops 121-D. Dummy D flip flops 121-D can be provided to equalize delay and to provide a glitch free waveform, D flip flops 121A, 121B and 121C can be configured as frequency dividers to divide a frequency of a signal received from external unit 20. For example, D flip flop 121A can divide a frequency of a received signal received from external unit 20 in half, D flip flop 121B can divide a frequency of a received signal received from D flip flop 121A in half, and D flip flop 121C can divide a frequency of a received signal received from D flip flop 121B in half. Dummy D flip flops 121-D1, 121-D2, and 121-D3 can be provided to equalize delay so that when processed frequency divided signals are input to logic circuit 122, delay between different signals can be equalized. For example, referring to the circuit diagram of FIG. 2, the depicted dummy D flip flop 121-D3 that is shown as being in communication with D flip flop 121B can delay a timing of second signal output by dummy D flip flop 121-D3 so that a timing of the second signal output by dummy D flip flop 121-D3 is equal to a timing of a first signal output by D flip flop 121C. By the time division performed by D flip flops 121A, 121B and 121C, such second signal can have as second frequency and the first signal can have as first frequency by the operations of waveform generating circuit 10 as set forth herein. Logic circuit 122 can output delay equalized PWN stress signal waveforms of different frequencies and duty cycles as set forth herein to different DUTs.

Figure 3:
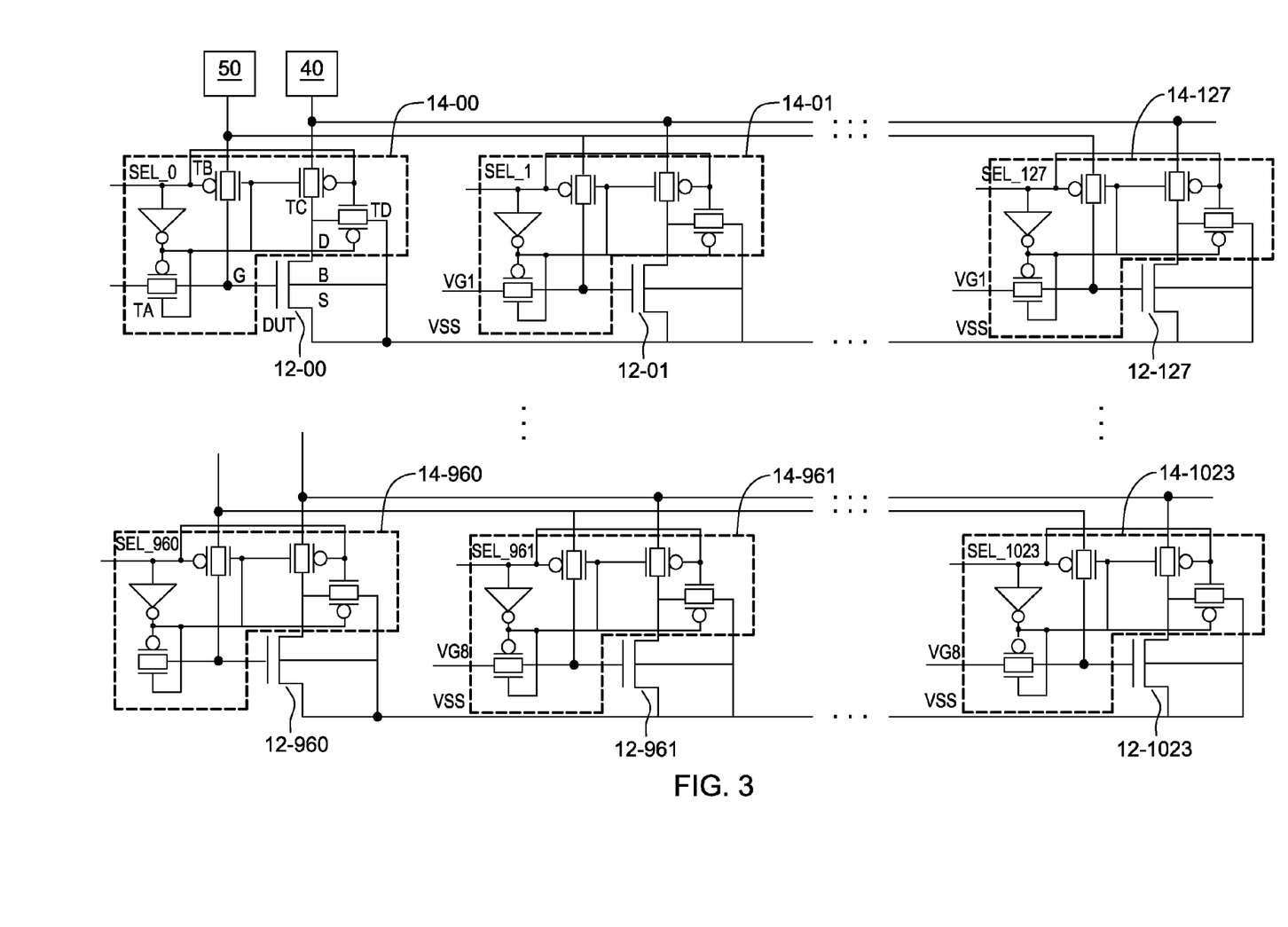
FIG. 3 is a circuit block diagram of an array of test devices having associated selection circuits for switching between a stress cycle and a sense cycle.
Figure 4:
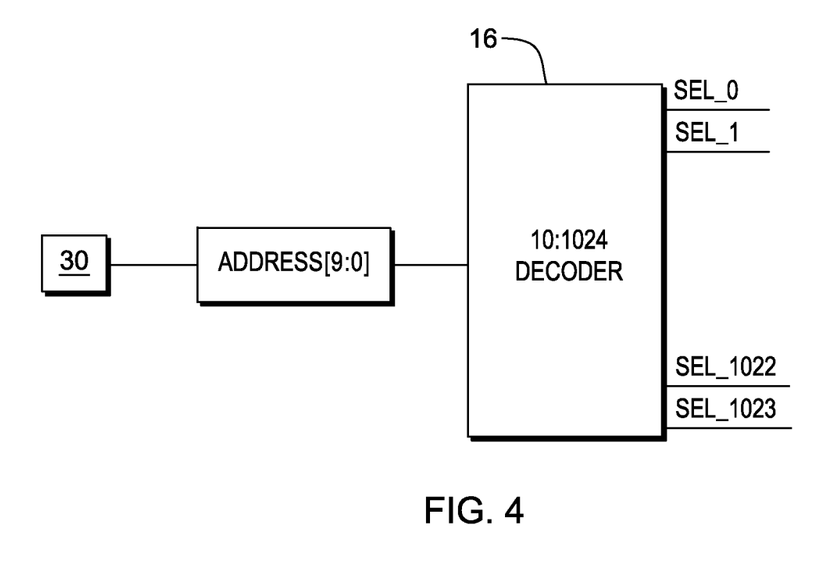
FIG. 4 is a circuit block diagram of a decoder circuit in communication with a plurality of selection circuits.

The gate voltages VG1-VG8 generated by waveform generating circuit 10 as shown in FIG. 2 can be provided to an array of test devices 12-00 through 12-1023 as shown in FIG. 3. In the example described with reference to FIG. 3, each gate voltage of a set of eight gate voltages VG1-VG8 can be applied to a set of 128 test devices. The gate voltages VG1-VG8 can be differentiated in terms of duty cycle and pulse width. The set of test devices to which a certain gate voltage (e.g. gate voltage VG1 to test devices 12-00 through 12-127) can be applied can be differentiated based on one or more characteristic. For example, the set of test devices to which a certain gate voltage can be applied can be differentiated in terms of gate length.

In the example of FIG. 3, test devices 12-00, 12-01, 12-127, 12-960, 12-961 and 12-1023 of the array of test devices 12-00 through 12-1023 are illustrated.

An exemplary selection circuit 14-00 is shown in FIG. 3. Referring to exemplary selection circuit 14-00 as shown in FIG. 3 for an individual test device (DUT) provided by a Field Effect Transistor (FET), selection circuit 14-00 for use in testing test device 12-00 can include transfer gates TA, TB, TC, and TD. Selection circuit 14-00 can be used to switch test device 12-00 between a stress cycle and a test cycle. Remaining selection circuits 14-01 through 14-1023 for the array as shown in FIG. 3 can be configured in the manner of selection circuit 14-00.

An exemplary decoder circuit is shown in FIG. 3. Regarding exemplary decoder circuit 16 as shown in FIG. 3, decoder circuit 16 can receive a sequence of addresses identifying devices of the array of test devices 12-00 through 12-1023 as shown in FIG. 3 from an external unit 30. External unit 30 can include an array of SMUs in one embodiment. External unit 30 can generate a sequence of addresses. When an address of a specific one test device is presented at an input to decoder circuit 16, decoder circuit 16 can present to a selection circuit for the specific one test device control signals for switching the device from a stress cycle to a sense cycle. Semiconductor structure 100 can be configured so that when one test device of an array of test devices 12-00 through 12-1023 is in a sense cycle, remaining test devices of the array of test devices 12-00 through 12-1023 are operating under a stress cycle.

Decoder circuit 16, by controlling operation of selection circuits 14-00 through 14-1023, can be polling each of a set of DUTs (e.g., test devices 12-00 through 12-1023) one by one. Its output pins are SEL_0 to SEL_1023. A stress cycle and a test cycle are set forth in reference to a description of exemplary selection circuit 14-00 set forth in FIG. 3.

Operation of exemplary selection circuit 14-00 and exemplary test device 12-00 during a stress cycle is as follows. When SEL_0 is High, transfer gate Ta is closed and a pulse from waveform generating circuit 10 is transmitted to a gate of test device 12-00. When SEL_0 is High, Tb and Tc are open and Td is closed. A source, drain and body of test device 12-00 can be connected to VSS as shown in FIG. 3.

The arrangement wherein SEL_0 is High, Ta and Td are closed, and Tb and Tc are open results in stressing of test device 12-00.

Operation of exemplary selection circuit 14-00 and exemplary test device 12-00 during a sense cycle is as follows. When SEL_0 is Low, Ta and Td can be open and Tb and Td can be closed. With such arrangement, a drain of test device 12-00 can be connected to an external unit 40. External unit 40 can be an SMU which supplies a sense drain voltage. Gate G of test device 12-00 can be connected to an external unit 50. External unit 50 can be an SMU which can supply a gate sense voltage and can also read a gate leakage current. During a sense cycle, a current passing through a test device 12-00 can be measured. External unit 50 in one embodiment can be configured to determine that a failure of the test device 12-00 has occurred if a measured current passing through test device 12-00 exceeds a threshold value. The threshold value can depend on a size of the test device 12-00.

The control of selection circuit 14-00 for providing a sense cycle as is set forth in reference to the description of selection circuit 14-00 for control of test device 12-00 can be applied to remaining selection circuits 14-00 through 14-1023 set forth in FIG. 3

Figure 5:
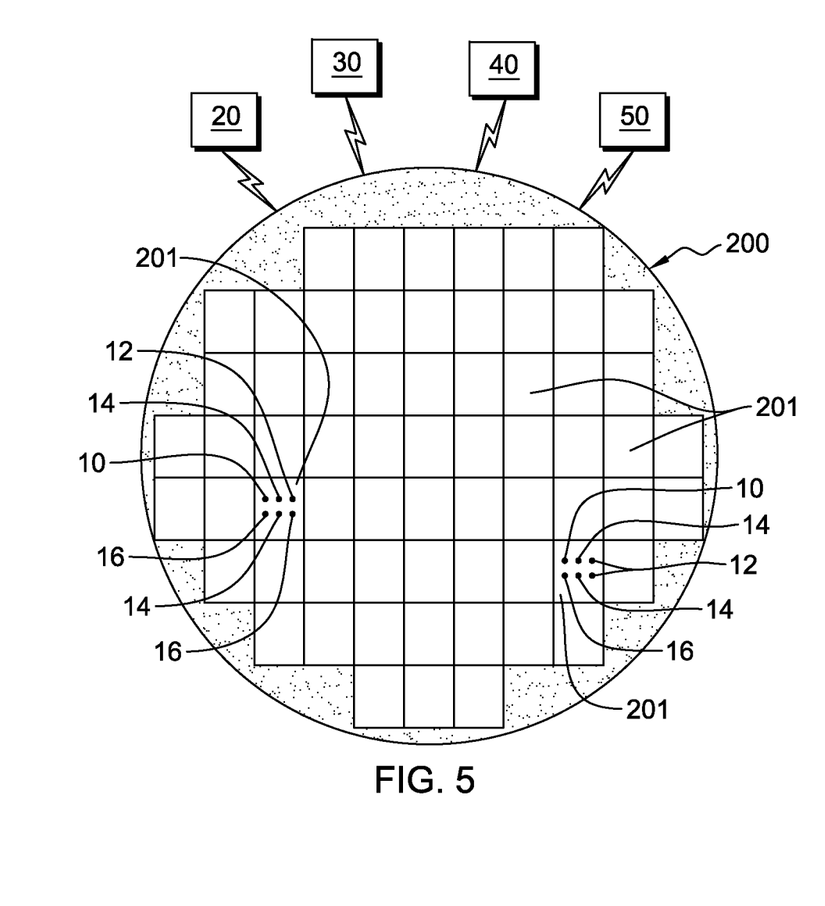
FIG. 5 is a schematic diagram of a semiconductor wafer.

FIG. 5 depicts a wafer 200, in accordance with one or more aspects set forth herein. By way of overall context, in one embodiment, during semiconductor fabrication processing, devices such as FETs and diodes can be formed on wafer 200, including within multiple dies 201. Each of wafer 200 and dies 201 can be regarded to be a semiconductor structure 100 as set forth herein. In a later phase of fabrication processing, wafer 200 can be cut apart to separate the dies for packaging as individual microchips (integrated circuits). To facilitate testing of the integrated circuits, one or more test device 12 having an associated selection circuit 14 can be provided on wafer 200 during the fabrication process. In the illustrated embodiment, there is provided multiple test devices 12 and multiple selection circuits 14 disposed on each die 201, so that when each die 201 is separated, it can include a plurality of test devices 12 each having an associated selection circuit 14. Each die 310 can further include one or more waveform generating circuit 10 and one or more decoder circuit 16 as shown in FIG. 5. External units 20 30, 40, 50 can be external to wafer 200 and dies 201. External units 20, 30, 40, 50 external to wafer 200 and dies 201 can be provided to be in communication with one or more of a waveform generating circuit 10, a decoder circuit 16, a selection circuit 14 or a DUT 12 as set forth herein before or separation of dies 201 that define wafer 200. A reference to a selection circuit 14 as set forth herein is a reference to any of selection circuits 14-A, 14-B (FIG. 1), 14-00 through 14-1023 (FIG. 3) as set forth herein. A reference to a DUI 12 as set forth herein is a reference to any of selection circuits 12-A, 12-B (FIG. 1), 12-00 through 12-1023 (FIG. 3) as set forth herein.

Figure 6:
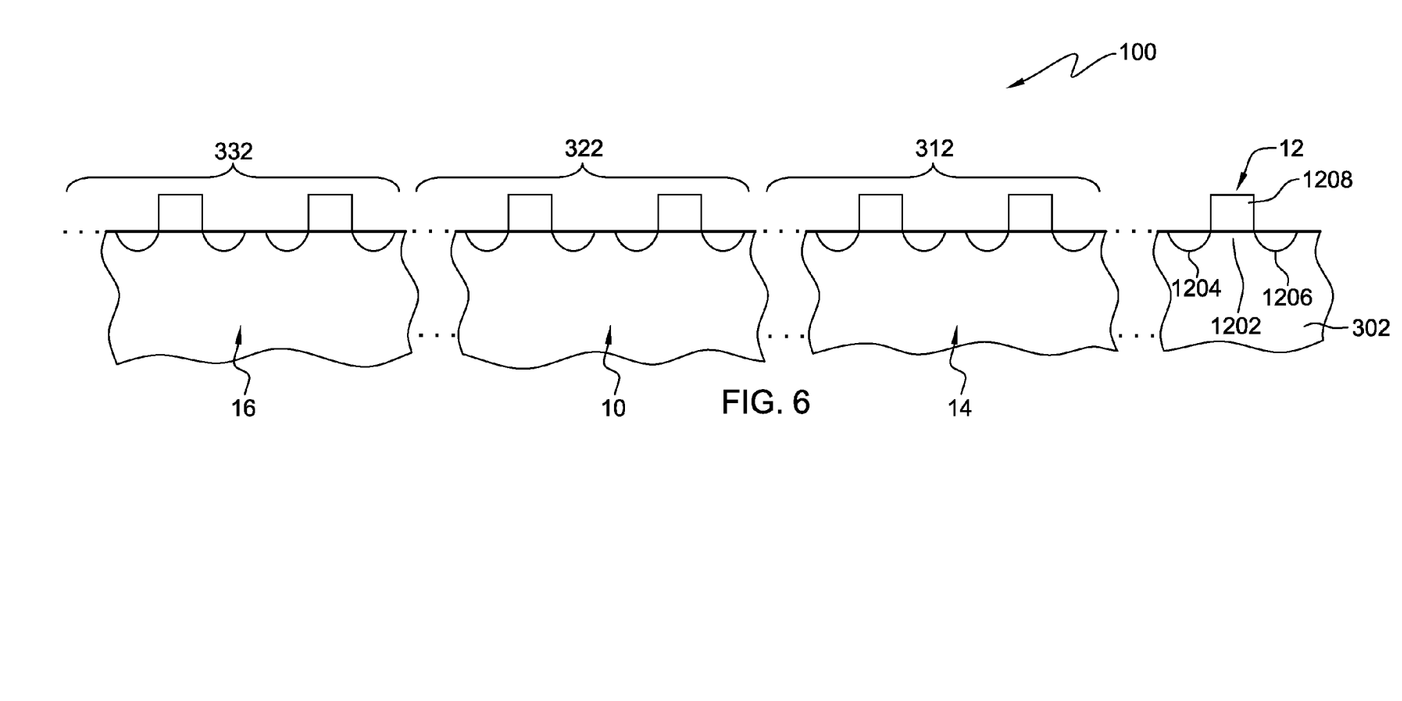
FIG. 6 is a schematic diagram of a semiconductor structure having a test device, a selection circuit, a waveform generating circuit, and a decoder circuit formed on a substrate.

Referring to FIG. 6, semiconductor structure 100, which can be provided e.g. by wafer 200 or die 201, can include a substrate 302. Semiconductor structure 100 can include a plurality of test devices 12 of which one is shown in FIG. 6. Each test device 12 can be formed on substrate 302 by having a channel area 1202, a source 1204, and drain 1206 defined in substrate 302 and gate 1208 formed around substrate 302. Substrate 302 can be a silicon substrate. Devices 312 forming selection circuits 14 of which selection circuit 14 is shown in FIG. 6, can be formed on substrate 302. Devices 322 forming wave generating circuit 10 and devices 332 forming decoder circuit 16 can also be formed on substrate 302 of semiconductor structure 100. Accordingly, wave generating circuit 10, selection circuit 14 and decoder circuit 16 can be formed on substrate 302. Substrate 302 in one embodiment can be a silicon substrate. Substrate 302 in one embodiment can be a fin section of a substrate which includes a bulk section below the fin section. Substrate 302 in one embodiment can be a bulk section of a substrate which includes a bulk section but which does not include a fin section. Substrate 102 in one embodiment can be a substrate supporting a nanowire FET architecture.

One of the goals of the testing described herein is to analyze the performance of devices of a semiconductor structure having both test devices and devices other than test devices. For instance, by performing stress testing on the test devices using currents and voltages that are beyond the rated operational ranges for the test devices, it is possible to simulate how the test devices would behave over extended periods of time, such as periods with a greater duration than the test duration. Because such testing may be destructive, sacrificial test devices may be used to perform such testing, and results for the test devices will be strongly correlated with results for devices of the integrated circuits.

In one embodiment, the test devices 12 are interspersed among the one or more dies 201 on wafer 200, and formed using the same fabrication processing steps as one used to form the one or more devices of wafer 200 other than the test devices. Therefore, the test devices 12 closely represent the behavior of actual devices of the wafer 200. To represent a variety of actual devices, the different test devices may have the same or different characteristics. In one example, different gate lengths, dielectric thicknesses, materials choices, or device types may be used as test devices on different portions of wafer 200.

Another of the goals of the testing is to analyze the fabrication processing techniques themselves, and in particular, the variation in the process within a die and within a wafer, For instance, by sensing the different test devices within the multiple dies of the wafer, and comparing the results for the different sensed test devices, fabrication variability over the wafer may be determined. The results of such testing may be used to determine one or more root causes of the performance variability, and may be critical in the research and development phase.

During fabrication processing, a semiconductor structure having one or more test device may be completed and ready to test at an early stage. For example, a semiconductor structure having a test device may be created during front-end of line (FEOL) processing. The wafer may be tested at the completion of FEOL processing, and before BEOL processing. Advantageously, early test results obtained before the wafer is fully fabricated may allow for tuning of processes, quicker time to discovery of fabrication faults, etc.

The fabrication processing disclosed herein may include numerous steps in which materials may be introduced onto or within the wafer, using for example, chemical vapor deposition, atomic layer deposition, epitaxial growth, oxidation treatment, etc, For instance, the wafer may be patterned and etched, and the wafer may be exposed to various processing treatments, such as photolithographic patterning, isotropic or anisotropic etching, plasma treatment, annealing (including spike annealing), etc. Fabrication processing may include front-end of line (EOL) processing, in which individual devices are created, including, for example, metal-oxide-semiconductor field-effect transistors (MOSFETs), as well as capacitors, resistors, and other semiconductor devices. Such devices may be planar, or may be three dimensional, for example including a fin structure extending from the semiconductor substrate upon which the channel, source, and/or drain may be formed. These devices may be formed using various techniques, and their formation may include several steps of processing such as depositing or growing materials to create surface structures, isolating devices with shallow or deep trenches that are filled with isolation materials, forming n-type and p-type wells by doping one or more portions, providing gate structures, establishing source and drain structures, etc.

In one example, the wafer 200 may be or include any silicon-containing substrate material including, but not to, single crystal Si, polycrystalline Si, amorphous Si, Si-on-nothing (SON), Si-on-insulator (SOI), or Si-on-replacement insulator (SRI) substrates. In other examples, the wafer may be or include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof; or an alloy semiconductor including GaAsP, AlInAs, GaInAs, GaInP, or GaInAsP or combinations thereof.

Another of the goals of the testing is to analyze the fabrication processing techniques themselves, and in particular, the variation in the process within a die and within a wafer. For instance, by sensing the different test devices within the multiple dies of the wafer, and comparing the results for the different sensed test devices, fabrication variability over the wafer may be determined. The results of such testing may be used to determine one or more root causes of the performance variability, and may be critical in the research and development phase.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "'include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

The invention claimed is:

1. An apparatus comprising:
   a semiconductor structure having a substrate;
   a plurality of test devices formed on the substrate, the plurality of test devices including a first test device and a second test device; and
   a waveform generating circuit formed on the substrate, the waveform generating circuit configured for application of a first stress signal waveform to the first test device, and a second stress signal waveform to the second test device, the first stress signal waveform having a first duty cycle, the second stress signal waveform having a second duty cycle.

2. The apparatus of claim 1, wherein the apparatus includes a selection circuit formed on the substrate associated with each of the first test device and the second test device for switching between a stress cycle and a sensing cycle.

3. The apparatus of claim 1, wherein the waveform generating circuit includes a flip flop for performing frequency division on a received signal.

4. The apparatus of claim 1, wherein the waveform generating circuit includes a dummy flip flop for equalizing a delay between signals having different frequencies.

5. The apparatus of claim 1, wherein the waveform generating circuit is configured to apply the first stress signal waveform to the first test device, and the second stress signal waveform to the second test device simultaneously.

6. The apparatus of claim 1, wherein the apparatus includes a decoder in communication with the selection circuit associated with each of the first test device and the second test device for use in polling the first test device and the second test device.

7. The apparatus of claim 1, wherein the semiconductor structure is provided by a die which includes the first test device, the second test device, and the waveform generating circuit.

8. The apparatus of claim 1 wherein the apparatus includes an external unit external to the semiconductor structure for providing a clock pulse to the waveform generating circuit.

9. The apparatus of claim 1, including a decoder formed on the substrate, wherein the apparatus includes an external unit external to the semiconductor structure for providing a sequence of addresses to the decoder.

10. The apparatus of claim 1, wherein the waveform generating circuit for generating the first stress signal waveform having a first duty cycle, and the second stress signal waveform having a second duty cycle, divides a frequency of a received signal.

11. A method comprising:
    applying a first stress signal waveform to a first test device formed on a substrate; and
    applying a second stress signal waveform to a second test device formed on the substrate;
    wherein the first stress signal waveform has a first duty cycle, wherein the second stress signal waveform has a second duty cycle, and wherein the applying a first stress signal waveform and applying a second stress signal waveform includes using a waveform generating circuit formed on the substrate.

12. The method of claim 11, wherein the applying a first stress signal waveform and applying a second stress signal waveform occurs simultaneously.

13. The method of claim 11, wherein the waveform generating circuit divides a frequency of a received signal for generating the first stress signal waveform and the second stress signal waveform.

14. The method of claim 11, wherein the waveform generating circuit delays a second signal having a second frequency so that the second signal has a timing equal to a timing of a first signal.

* * * * *